United States Patent [19]

Young

[11] 4,242,536
[45] Dec. 30, 1980

[54] ALUMINUM-STABILIZED MULTIFILAMENTARY SUPERCONDUCTOR

[75] Inventor: Morris S. Young, Murray Hill, N.J.

[73] Assignee: Airco, Inc., Montvale, N.J.

[21] Appl. No.: 4,138

[22] Filed: Jan. 17, 1979

Related U.S. Application Data

[62] Division of Ser. No. 737,868, Nov. 1, 1976, Pat. No. 4,148,129.

[51] Int. Cl.³ .......................................... H01B 12/00
[52] U.S. Cl. .................................. 174/128 S; 29/599; 335/216
[58] Field of Search .................. 174/126 S, 128 S; 29/599; 335/216

[56] References Cited

U.S. PATENT DOCUMENTS

| | | | |
|---|---|---|---|
| 3,778,894 | 12/1973 | Kono et al. | 174/126 S X |
| 3,778,895 | 11/1973 | Nomura et al. | 174/126 S X |
| 3,837,066 | 9/1974 | Mori et al. | 174/126 S X |
| 4,028,488 | 6/1977 | McDougall | 174/126 S X |
| 4,094,060 | 6/1978 | Madsen et al. | 174/126 S |
| 4,135,293 | 1/1979 | Madsen et al. | 174/126 S X |

*Primary Examiner*—Arthur T. Grimley
*Attorney, Agent, or Firm*—Edmund W. Bopp; Larry R. Cassett

[57] ABSTRACT

A multifilamentary superconductor having a large number of NbTi filaments in an aluminum alloy matrix which is stabilized by a high-purity aluminum sheath is disclosed, together with the method of its manufacture. An Al alloy billet having a number of NbTi rods disposed therein is extruded. A superpure Al sheath is added; this product is then enclosed in copper and wire-drawn after which the copper is etched off.

1 Claim, 5 Drawing Figures

ALLOY BILLET PREPARED; SUPER CONDUCTING RODS INSERTED

EXTRUDED AND CLEANED

ENCASED IN SUPER PURE AL. AND IN Cu.

ALUMINUM-STABILIZED MULTIFILAMENTARY SUPERCONDUCTOR

This is a division of application Ser. No. 737,868, filed Nov. 1, 1976 now U.S. Pat. No. 4,148,129, issued Apr. 10, 1979.

FIELD OF THE INVENTION

The present invention relates to the manufacture of aluminum-stabilized multifilamentary superconductors.

BACKGROUND OF THE INVENTION

The phenomenon of superconductivity—that is, zero electrical resistance—which is exhibited by many metals at low temperatures, is of great scientific and commercial value, since it permits various sorts of high-powered devices to operate with minimal losses of electrical power. The phenomenon is defeated by the exceeding of any one of three parameters: a critical temperature ($T_c$), a critical magnetic field ($H_c$), and a critical current ($J_c$). Since the most interesting and useful applications of superconductivity involve high currents or fields, it has been the aim of the art of superconductor manufacture to produce conductors with the highest possible critical quantities. One material with useful superconducting properties is the alloy NbTi; alloys of Nb—40-60 at. % Ti are typically used.

It has been well known in the art for some time that one way to increase the operating parameters of a given superconductor is to "stabilize" it by providing a normally conductive alternate current path, so that if the superconductor should "go normal"—i.e., return to the normally conducting state—the current will have a shunt path. In this way higher currents can be passed through the superconductor without fear of momentary local variations in the current or the magnetic field destroying the superconductor. Furthermore, the shunt provides the superconductor with a time in which it can regain its superconductive properties.

It is also well known in the art that the tendency of superconductors to go normal is ordinarily a local phenomenon. Hence, it is important to locate the shunt in close physical proximity to the superconductor, in order that the whole of the current need not be diverted.

Bearing these points in mind, the superconductor designer, when selecting a stabilizing material, has these factors to consider: the electrical resistance of the material must be as low as possible, so that if it need carry current, it will generate as little heat as possible, so that the superconductor returns from the normal state quickly and so that less stabilizer is required; its thermal conductivity should be high, so that any heat generated may be rapidly dispersed away, and also to save time in cooling the assembly to cryogenic temperatures before use of the superconductor; and it is preferably readily penetrable by magnetic flux, so as to reduce flux heating.

The material which best combines the above-listed characteristics is high-purity aluminum (99.999% pure). This material, though, while it offers the additional advantages of light weight, ready availability, and moderate cost, is not without its drawbacks. In particular, it has heretofore been impossible to mechanically co-work pure Al with the elements, compounds or alloys which have the most useful superconducting properties—e.g., NbTi or Nb$_3$Sn—since these alloys are very much harder and have a much greater tensile strength than aluminum. Hence, in the prior art, in the mechanical steps which are usually performed—e.g., extrusion, drawing, rolling, and swaging—the aluminum did not stay in its original configuration with respect to the superconducting materials.

It is well known in the superconductor art that the critical current density $J_c$ of a given material is dependent on the form of the specimen under test, and that wires of small diameter (i.e., on the order of micrometers) perform much better than larger ones. Since wires of such microscopic dimensions are difficult to fabricate, the practice has been to encase a number of rods in a billet of suitable nonsuperconducting material and draw the whole to what would ordinarily be considered fine wire size.

Thus, although it has been possible in the prior art to stabilize a monofilamentary superconductor with aluminum (see, for example, U.S. Pat. No. 3,514,850, "Electrical Conductors", issued to Barber et al) this has not been sufficient to satisfy the needs of the art; a multifilamentary conductor is needed.

It is therefore an object of the invention to provide an aluminum-stabilized multifilamentary superconductor.

It is a further object of the invention to provide a method whereby such a superconductor can be made readily and economically.

Other aspects and objects of the invention will appear to those skilled in the art.

SUMMARY OF THE INVENTION

The present invention satisfies the desire felt in the superconductor art for an aluminum-stabilized multifilamentary superconductor by providing a two-step process. First a billet of an aluminum alloy is prepared, having disposed therein in a geometrically symmetric pattern a plurality of rods of superconductive material. This product is extruded and cleaned. A sheath of superpure aluminum is then added; this is in turn enclosed in a metallic sheath, which may, typically, be made of copper. This product may then be wiredrawn; due to the symmetric properties of the alloy-NbTi configuration, the pure Al is uniformly constricted in its movement, and is enclosed by the sheath. In this way a multifilamentary NbTi superconductor may be stabilized by pure aluminum.

The invention will be better understood with reference to the drawings, in which FIGS. 1-4 represent the stages of the process of the invention and depict perspective views of the product of the invention as it appears after the corresponding stages; and FIG. 5 represents a preferred arrangement of the product of the invention in a preliminary stage.

DESCRIPTION OF THE PREFERRED EMBODIMENTS

Figure 1:
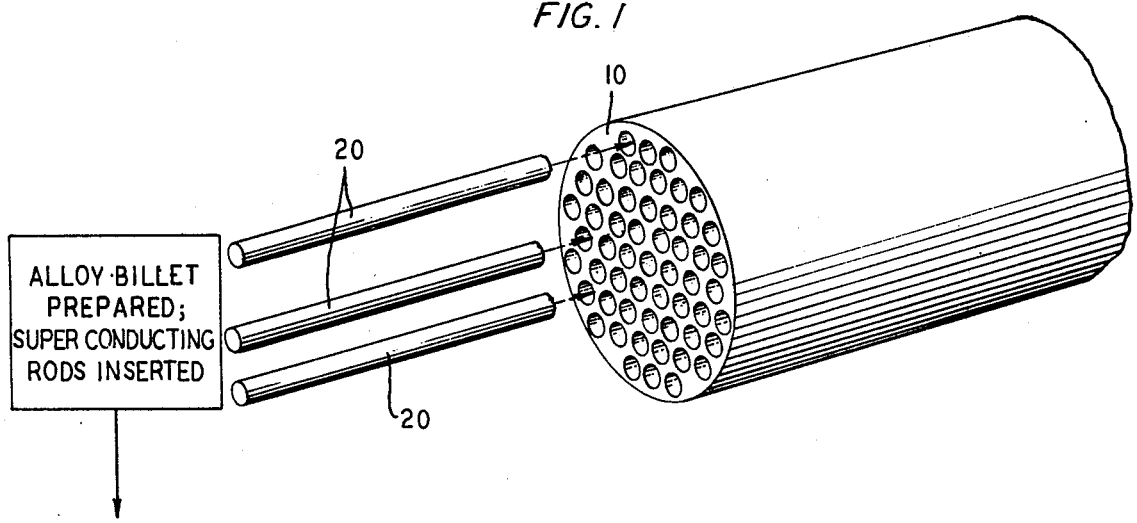

Referring now to FIG. 1, there is depicted a billet 10 of an aluminum alloy. A plurality of rods 20 of superconductive material are inserted into a like number of holes in the billet. The number of the holes is not in itself crucial, but it is essential that they be symmetrically arranged so that, when extruded, the pressure on each rod is as close to being equal as possible to that on the others. In a specific embodiment 55 rods of Nb-45 at. % Ti, each of 0.178" diameter, were inserted in holes drilled in a 3" long by 2" diameter billet made of an alloy conforming to the American Aluminum Association's specifications for "1100" alloy (0.05%–0.20% Cu, minimum 99.00% Al).

Figure 2:
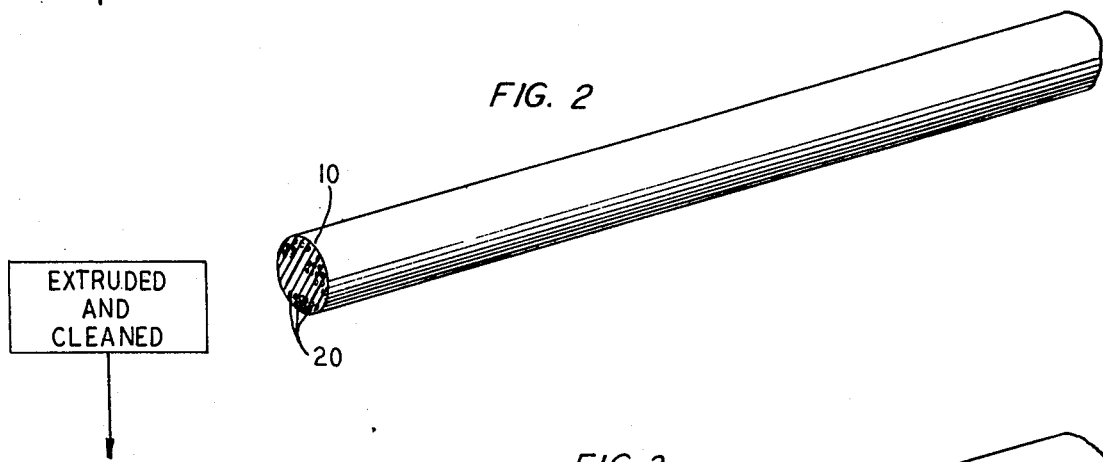

In FIG. 2, the billet depicted in FIG. 1 is shown elongated by the extrusion process. In the embodiment described above, the billet was preheated to 155° C. and was ⅜" in diameter by roughly 30" long after extrusion.

Figure 3:
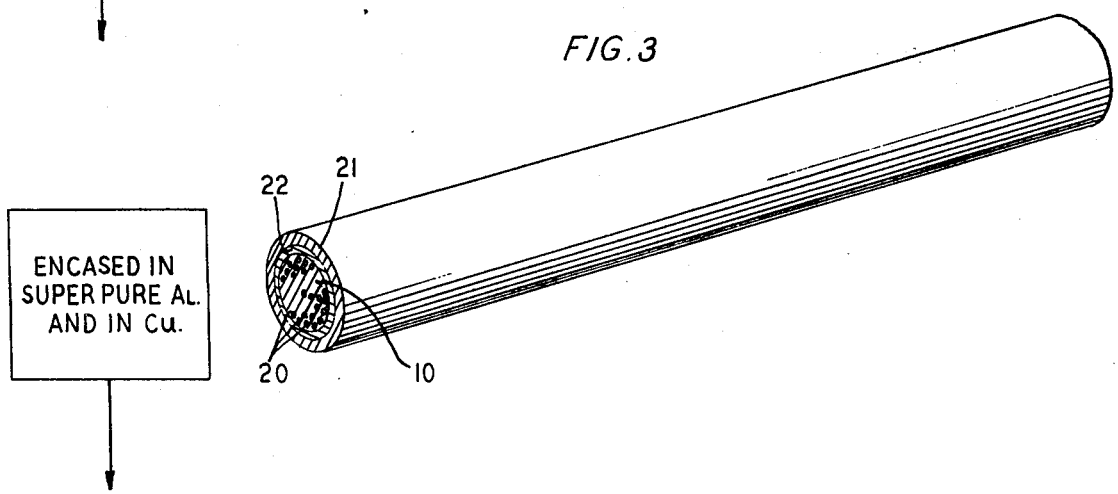

In FIG. 3, the extruded billet of FIG. 2 is shown encased in concentric tubes 21, 22 of, first, pure Al 22, and then Cu 21. The billet may be advantageously first cleaned by polishing, degreasing and etching. The ⅜"×30" extruded billet discussed above was at this point 0.56" in diameter; the pure Al tube was 0.745" O.D. and 0.57" I.D., and the (industrial purity) Cu tube 1" O.D. by 0.75" I.D.

Figure 4:
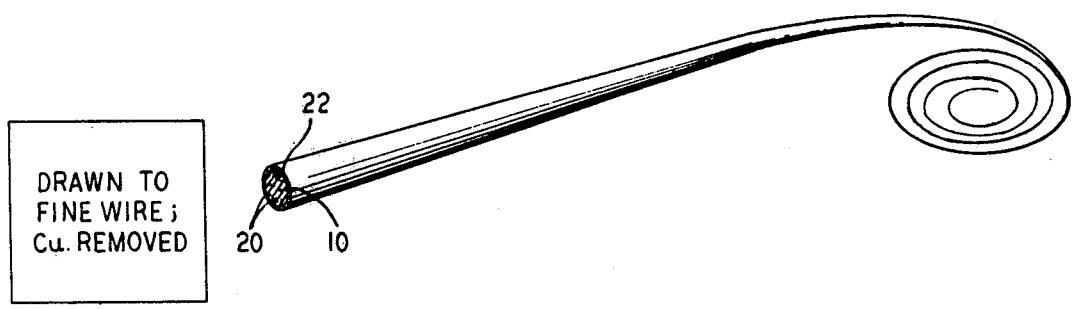

In FIG. 4, the final product is shown. The double-sheathed billet has been wiredrawn to a desired size (in the process described, 26 mils, in drawing steps of typically 10% area reduction per pass) and the outermost Cu sheath removed with nitric acid.

In this way the soft superpure Al stabilized composite may be drawn readily to size.

As mentioned above, while the number of rods in the billet is not in itself crucial, it seems to be essential that they be arranged in a way which will ensure that the force on each individual rod is equal in all directions, and equal to the force on every other rod. It is believed that in this way the softness of the aluminum as compared with the NbTi rods is of less importance. The arrangement is equivalent, as far as the Al is concerned, to a unitary center core. Furthermore, the enclosure of the billet within the soft Al sheath and the enclosure of this assembly in Cu insures that the composite will co-reduce as if it were one material; the softer Al has nowhere to go.

Figure 5:
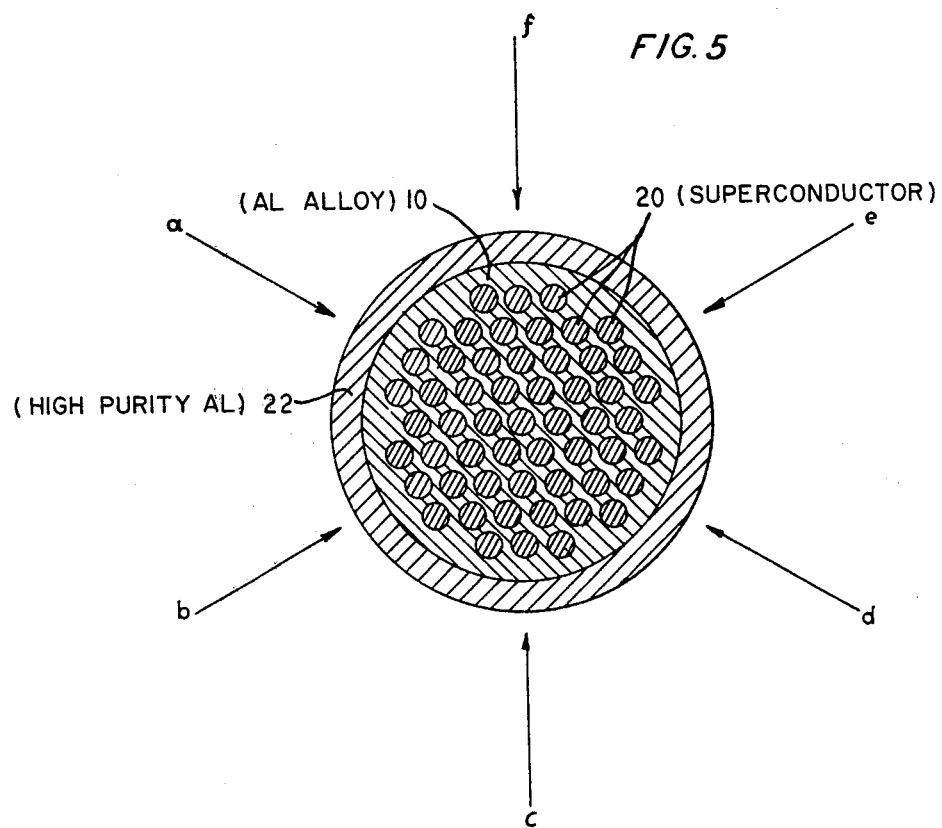

FIG. 5 shows an arrangement of 55 NbTi rods which is suitable for the process of the invention. It will be noticed by examining FIG. 5 along lines a-f that the arrangement is at once nearly circular in outline and yet is the same in each of six orientations. If, for example, the arrangement were filled in at the corners, resulting in a fully hexagonal array, it would no longer be close enough to circularity to be satisfactory.

It is often found advantageous to heat-treat superconductive materials, although not always for the same reasons. In the case of the compound $Nb_3Sn$, heat treatment is necessary to form the compound; in the case of NbTi, its superconductive performance is improved by a heat treatment (of typically 24–72 hours at 350°–375° C.). It is generally believed that this treatment of NbTi is only effective after extensive cold-working, as the heat treatment is effective through a normalization of crystal dislocations formed during, e.g., drawing. This means that the heat-treatment must be performed after the product has been drawn nearly to its finished size, or at the finished size.

Unfortunately, to some extent the purity of the outer sheath of Al is contaminated during heat treatment; the alloying elements tend to diffuse into the purer metal. This effect can be to some extent limited by one's choice of alloys, it being found that 1100-type alloys are less contaminative than, for example, those of the 6061-type. A second or supplemental solution is to use more pure Al than is necessary and to trim off the excess after heat treatment; in this way the impurities are diffused over a greater volume and are not as damaging. In any event, adequate electrical conductivities have been achieved: in a specific example, the heat-treatment was performd after the conductor has been drawn to its final 26 mil diameter and the copper jacket had been etched off. The treatment included a warmup over eight hours to 280° C., which temperature was held for one hour. The temperature was then raised to 340° C. which was held for sixty hours. The ultimate resistivity of the entire conductor was $0.58 \times 10^{-8}$ ohm-cm at 9K (i.e., before the NbTi became superconducting); a critical current density of $4.12 \times 10^4$ $A/cm^2$ in a 5 Tesla magnetic field (again calculated over the cross-section of the entire conductor) was observed.

What is claimed is:

1. A composite superconductor comprising a plurality of superconductive filaments symmetrically dispersed in a matrix of aluminum alloy having substantially the electrical and thermal conductivity and the mechanical properties of an alloy of at least 99.00% Al and 0.05–0.20% Cu, said matrix being in intimate contact with a surrounding stabilizing sheath of aluminum of nominal 99.999% purity.

* * * * *